United States Patent
Huang et al.

(10) Patent No.: US 7,375,741 B2
(45) Date of Patent: May 20, 2008

(54) CIRCUIT AND METHOD FOR ELIMINATING IMAGE INTERFERING WITH DESIRED CHANNEL

(75) Inventors: Jian-Jiang Huang, Hsinhua (TW); Yuan-Kai Chu, Hsinhua (TW)

(73) Assignee: Himax Technologies Limited, Tainan County (TW)

( * ) Notice: Subject to any disclaimer, the term of this patent is extended or adjusted under 35 U.S.C. 154(b) by 532 days.

(21) Appl. No.: 11/087,497

(22) Filed: Mar. 24, 2005

(65) Prior Publication Data

US 2006/0215063 A1    Sep. 28, 2006

(51) Int. Cl.
*H04N 5/21* (2006.01)
*H04N 5/911* (2006.01)

(52) U.S. Cl. .................. 348/21; 348/607; 348/470; 348/622; 348/731; 455/304; 455/114.2

(58) Field of Classification Search ............... 348/731, 348/606, 622, 470, 21; 375/346, 349, 350; 455/114.2, 296, 278.1, 303, 304, 137
See application file for complete search history.

(56) References Cited

U.S. PATENT DOCUMENTS

| | | | | |
|---|---|---|---|---|
| 4,263,616 A | * | 4/1981 | Lee ............................ 348/627 |
| 4,958,230 A | * | 9/1990 | Jonnalagadda et al. ....... 348/21 |
| 5,371,902 A | * | 12/1994 | Marz ........................... 455/304 |
| 5,574,496 A | * | 11/1996 | Nielsen et al. ................ 348/21 |
| 5,584,066 A | * | 12/1996 | Okanobu .................... 455/302 |
| 5,736,840 A | * | 4/1998 | Otaka et al. ................ 323/217 |
| 5,737,035 A | * | 4/1998 | Rotzoll ....................... 348/725 |
| 5,870,670 A | * | 2/1999 | Ripley et al. ............... 455/304 |
| 5,901,349 A | * | 5/1999 | Guegnaud et al. .......... 455/302 |
| 6,137,999 A | * | 10/2000 | Lovelace et al. ........... 455/302 |
| 6,151,373 A | * | 11/2000 | Dodley ....................... 375/348 |
| 6,314,279 B1 | * | 11/2001 | Mohindra ................... 455/304 |
| 6,356,747 B1 | * | 3/2002 | Miquel et al. .............. 455/324 |
| 6,441,843 B1 | * | 8/2002 | Limberg ...................... 348/21 |
| 6,529,719 B1 | * | 3/2003 | Imbornone et al. ......... 455/302 |
| 6,597,751 B1 | * | 7/2003 | Cutler ......................... 375/348 |
| 6,606,489 B2 | * | 8/2003 | Razavi et al. .............. 455/323 |
| 6,636,730 B2 | * | 10/2003 | Spargo et al. .............. 455/302 |
| 6,675,004 B1 | * | 1/2004 | Waylett ....................... 455/304 |
| 6,714,602 B1 | * | 3/2004 | Masayoshi et al. ......... 375/322 |
| 6,714,604 B1 | * | 3/2004 | Tsurumi et al. ............. 375/329 |
| 6,728,381 B1 | * | 4/2004 | Hosoya ...................... 381/94.1 |
| 7,015,981 B2 | * | 3/2006 | Kudo .......................... 348/723 |
| 7,046,979 B2 | * | 5/2006 | Lee ............................. 455/302 |
| 7,161,613 B2 | * | 1/2007 | Liu et al. ...................... 348/21 |
| 7,218,357 B2 | * | 5/2007 | Kim et al. ................... 348/607 |
| 7,274,410 B2 | * | 9/2007 | Birleson et al. ............. 348/731 |
| 2002/0183033 A1 | * | 12/2002 | Gu et al. .................... 455/302 |

* cited by examiner

*Primary Examiner*—David Ometz
*Assistant Examiner*—Jean W. Désir

(57) ABSTRACT

A circuit and a method for eliminating interference introduced from an image channel into a desired channel is described. The circuit includes a splitter and an adder. The splitter generates signals split from a received signal having frequency components within the desired and image channel. The adder adds together the signals output from the splitter. The circuit can be used in an TV tuner.

13 Claims, 6 Drawing Sheets

CIRCUIT AND METHOD FOR ELIMINATING IMAGE INTERFERING WITH DESIRED CHANNEL

BACKGROUND

1. Field of Invention

The present invention relates to telecommunications. More particularly, the present invention relates to telecommunications with a phase shift in at least one path.

2. Description of Related Art

FIG. 1A shows a conventional direct-down tuner. FIG. 1B shows frequency spectrums of the signals 101, 103, 105, and 107 respectively. The direct-down tuner uses tracking filters (102 and 104) to eliminate the frequency components of the RF signal 101 outside the desired channel (channel 39). A local oscillator 106 (LO) generates a reference signal at 372 MHz. The mixer 108 mixes the reference signal with the filtered RF signal 105 so that the filtered RF signal 105 is down-converted to an IF (intermediate frequency) signal 107. The desired IF band 110 is from 54 MHz to 60 MHz. The central frequency of the IF band 110 is 57 MHz. However, the frequency components of the RF signal 101 in the image channel (channel 58) cannot be completely suppressed or removed by the tracking filters 102 and 104, which results an interference from the image channel into the desired channel. Further, it is also difficult to integrate the tracking filters with other elements of the conventional tuner into a single chip.

FIG. 2A shows a conventional up-down tuner. FIG. 2B shows frequency spectrums of the signals 203, 207, 213, and 215 respectively. The RF signal 201 is up-converted by a mixer 205 cooperating with a local oscillator 212. The up-converted RF signal 207 is sent to a band-pass filter 204 (BPF). The mixer 206 cooperates with a local oscillator 214 down-converts the 213 to an IF signal 215. There is no image channel corresponding to the desired channel since the RF signal is up-converted before being down-converted to the IF signal. However, the conventional tuner in FIG. 2A involves high frequency operation (about 1 G Hz).

SUMMARY

It is therefore an objective of the present invention to provide a circuit and a method for eliminating interference introduced from an image channel into a desired channel.

It is another objective of the present invention to provide a TV tuner having the function of eliminating interference introduced from an image channel into a desired channel.

It is still another objective of the present invention to provide a circuit for eliminating interference introduced from an image channel into a desired channel, where the circuit can be easily integrated within a chip.

It is still another objective of the present invention to provide a circuit for eliminating interference introduced from an image channel into a desired channel, where the image channel is canceled before mixing with a reference signal to down-convert the RF signal.

It is still another objective of the present invention to provide a circuit for eliminating interference introduced from an image channel into a desired channel, where no tracking filter is used in the circuit.

It is still another objective of the present invention to provide a circuit for eliminating interference introduced from an image channel into a desired channel, where the circuit doesn't need to operate at a very high frequency.

In accordance with the foregoing and other objectives of the present invention, a circuit for eliminating interference introduced from an image channel into a desired channel is described. The circuit includes a splitter and an adder. The splitter generates signals split from a received signal having frequency components within the desired and image channel. The adder adds together the signals output from the splitter.

The received signal is split so that, in the output of the adder, frequency components within the desired channel is non-zero while those within the image channel is approximately zero.

In accordance with the foregoing and other objectives of the present invention, a tuner for extracting information on a desired channel without interference introduced from an image channel into the desired channel is described. The tuner includes a splitter, an adder, a mixer, and a band-pass filter. The splitter generates signals split from a received signal having frequency components within the desired and image channel. The adder adds together the signals output from the splitter. The mixer mixes the output of the adder with an oscillation signal having a frequency determined according to the desired channel. The band-pass filter filters an output of the mixer.

The received signal is split so that, in the output of the adder, frequency components within the desired channel is non-zero while those within the image channel is approximately zero.

In accordance with the foregoing and other objectives of the present invention, a method for extracting information on a desired channel without interference introduced from an image channel into the desired channel is described. The method includes the following steps. Signals split from a received signal having frequency components within the desired and image channel are generated. The split signals are added together. A result of the addition of the split signals is mixed with an oscillation signal having a frequency determined according to the desired channel. A result of the mixing is filtered.

The received signal is split so that, in the result of the addition of the split signals, frequency components within the desired channel is non-zero while those within the image channel is approximately zero.

The invention has at least the following advantages. Each embodiment may present one or more of the advantages. The circuit and the method can reject an image signal that interferes with a selected channel. The TV tuner has the function of rejecting an image signal that interferes with a selected channel. The circuit can be easily integrated within a chip. The image channel is canceled before mixing with a reference signal to down-convert the RF signal. No tracking filter is used in the circuit. The circuit doesn't need to operate at a very high frequency.

It is to be understood that both the foregoing general description and the following detailed description are examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
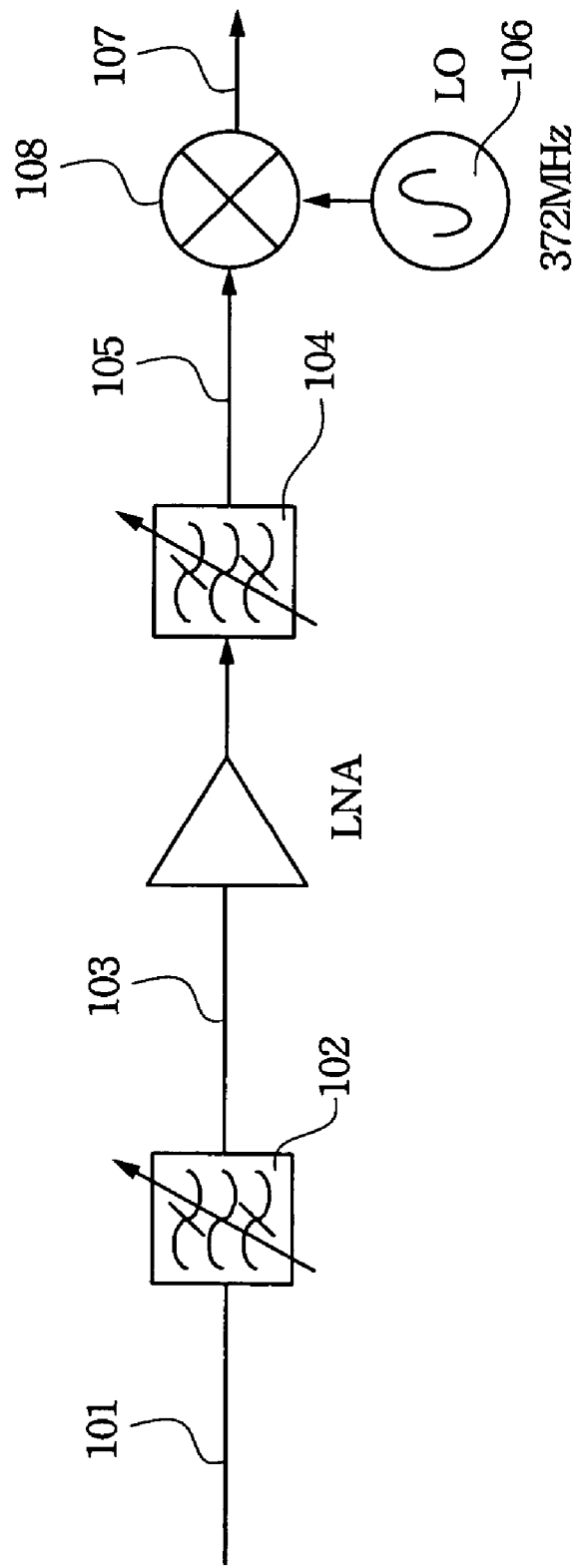
FIG. 1A shows a conventional direct-down tuner.
Figure 1B:
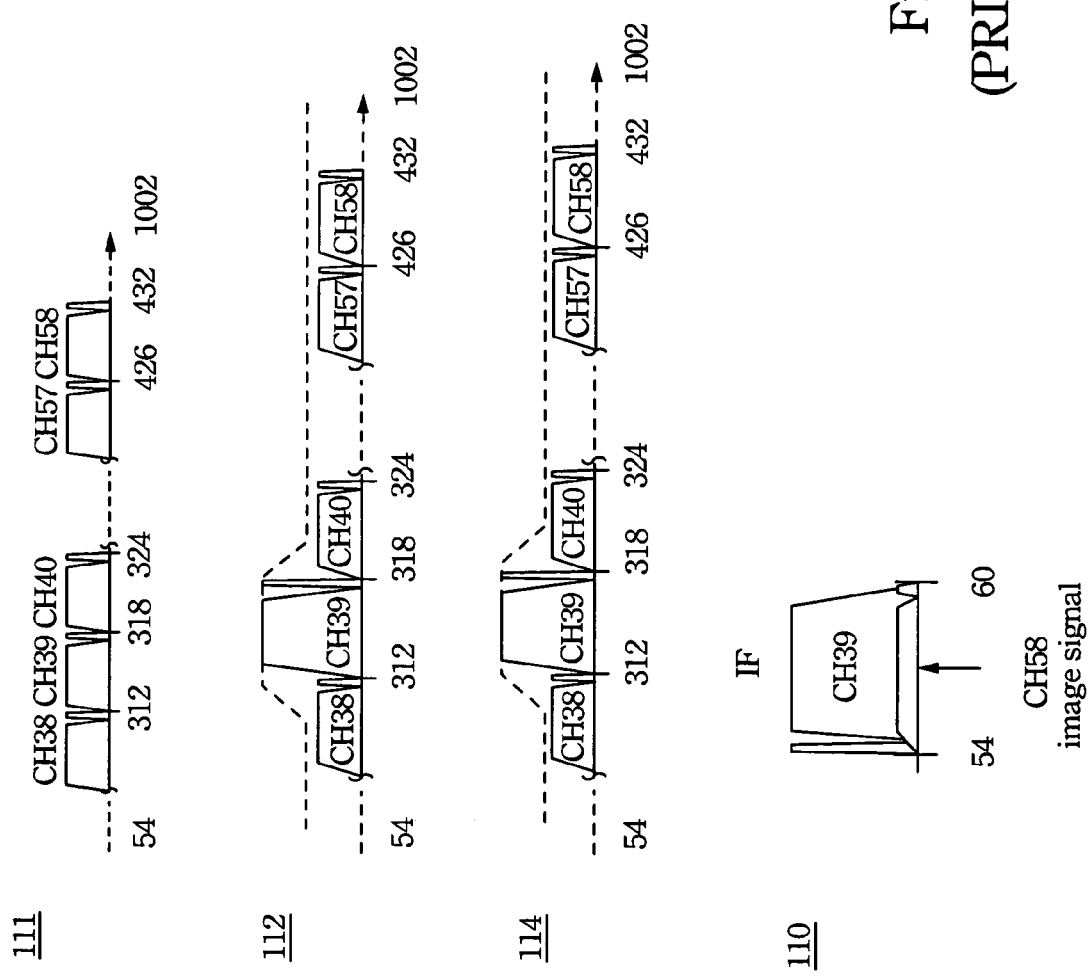
FIG. 1B shows frequency spectrums of signals shown in FIG. 1A.
Figure 2A:
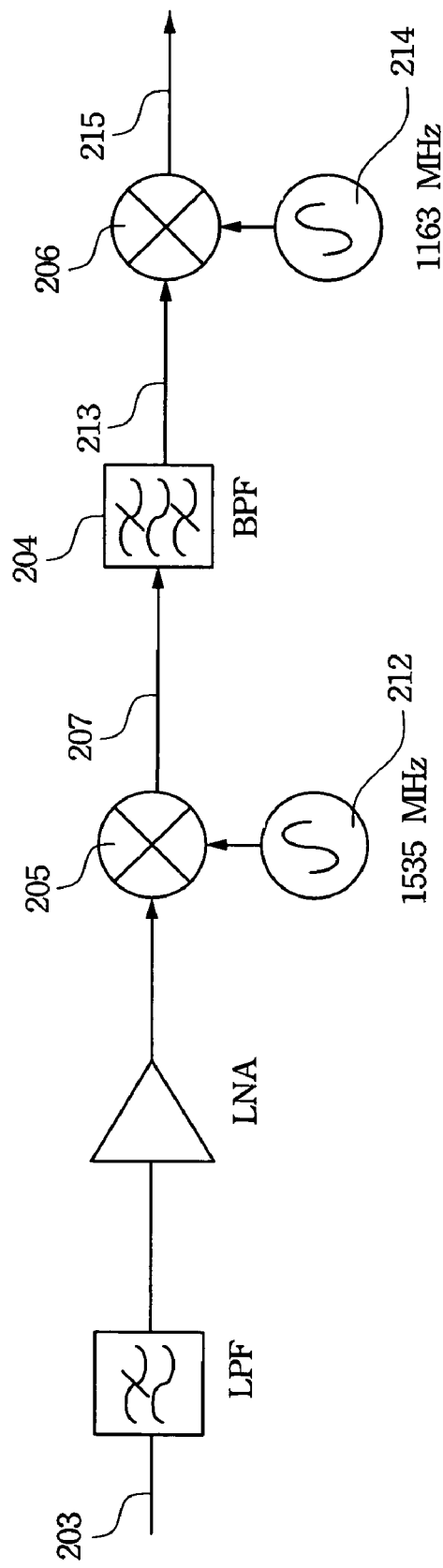
FIG. 2A shows a conventional up-down tuner.
Figure 2B:
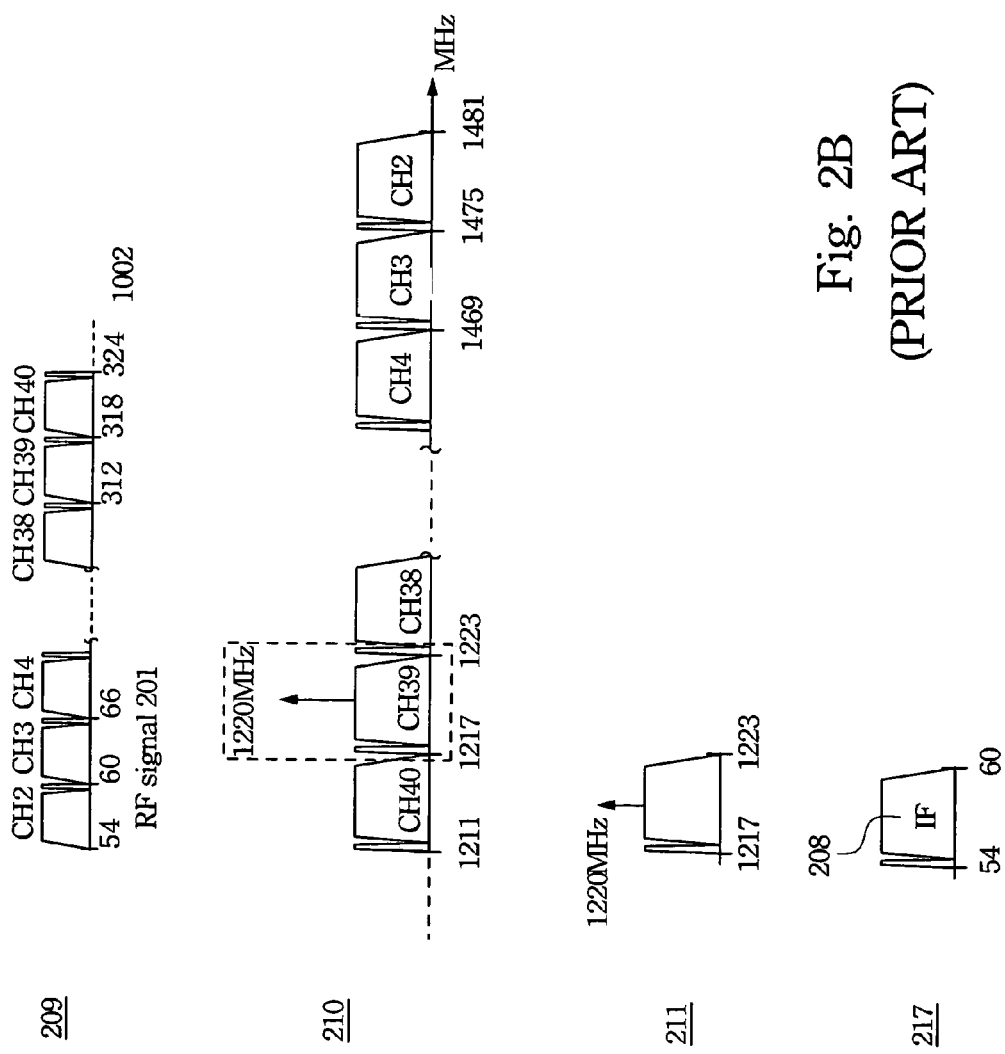
FIG. 2B shows frequency spectrums of signals shown in FIG. 2A.

Reference will now be made in detail to the present preferred embodiments of the invention, examples of which are illustrated in the accompanying drawings. Wherever possible, the same reference numbers are used in the drawings and the description to refer to the same or like parts.

Figure 3:
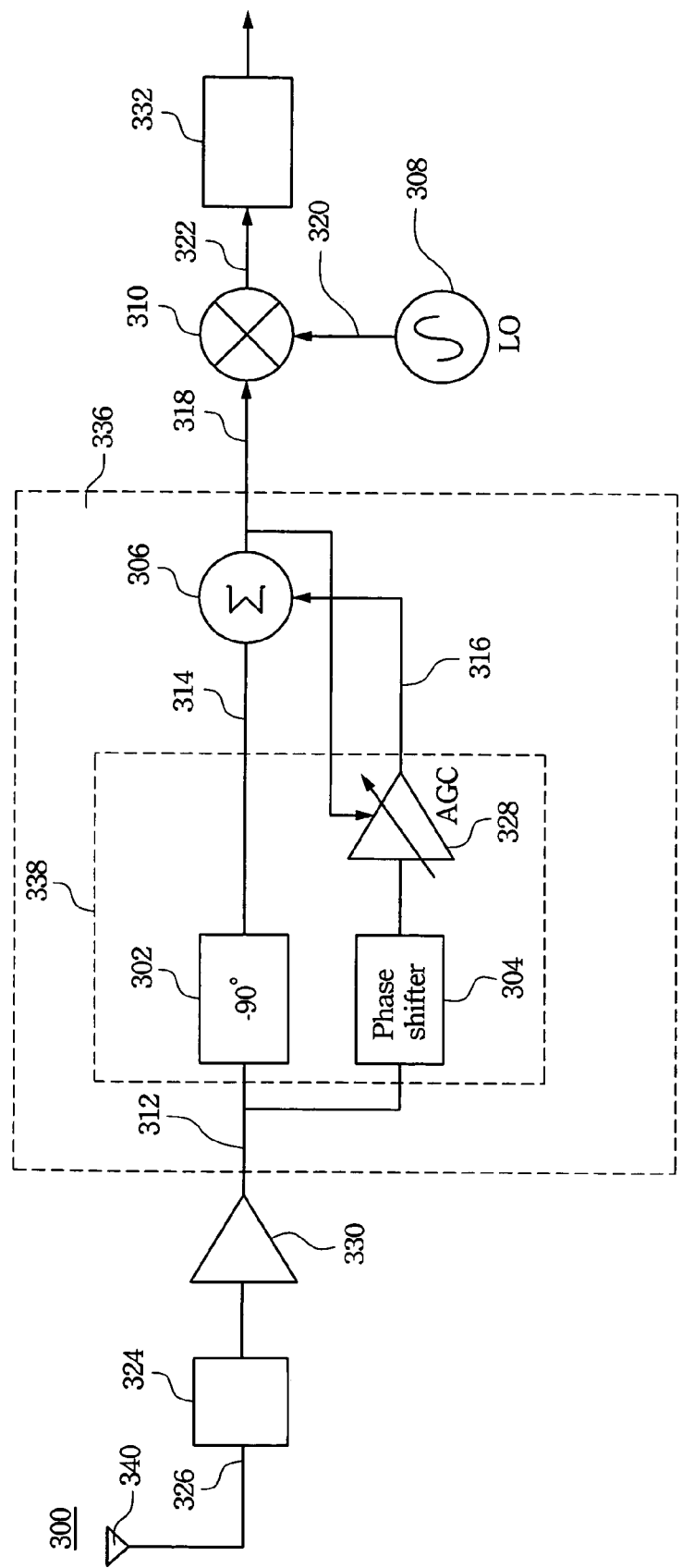
FIG. 3 shows a TV tuner according to one embodiment of the present invention.

FIG. 3 shows a TV tuner according to one embodiment of the invention. The tuner includes an antenna 340, low-pass filter 324, low-noise amplifier 330, a circuit 336, a local oscillator 308, a mixer 310 and a band-pass filter 332. The tuner receives an RF signal 326 through the antenna 340. The received RF signal 326 is purified by a low-pass filter (LPF) 324. The purified RF signal is further amplified by a low noise amplifier 330 (LNA), which results in the signal 312. The low-pass filter 324 suppresses the frequency components of the RF signal 326 outside all the TV channels. The circuit 336 eliminates interference introduced from an image channel (having a center frequency $f_{IM}$) into a desired channel (having a center frequency $f_{RF}$). The circuit 336 generates a combined signal 318 by suppressing the frequency components of the signal 312 within the image channel. The combined signal 318 is mixed with an oscillation signal 320 generated by a local oscillator 308 so that the combined signal 318 is down-converted to an IF signal 322. In this embodiment, the oscillation frequency $f_{LO}$ of the local oscillator 308 is $f_{RF}$+57 MHz so that the frequency components of the combined signal 318 within the desired channel are shifted into an IF band ranging from 54 to 60 MHz. A band-pass filter 332 (having a pass band from 54 to 60 MHz) filters the IF signal 322, whereby the frequency components of the IF signal 322 outside the pass band are suppressed. Thus, an IF signal carrying only the information in the desired channel of the received RF signal is derived at the output of the band-pass filter 332.

The circuit 336 will be explained in detail in the following. The circuit 336 includes a splitter 338 and an adder 306. The splitter 338 generates signals 314 and 316 split from the signal 312. As previously described, the signal 312 has only frequency components within all the TV channels including the desired one. The adder 306 adds together the signals 314 and 316 output from the splitter 338. The signal 312 is split so that, in the output of the adder 306, frequency components within the desired channel is non-zero while those within the image channel is approximately zero.

Figure 4:
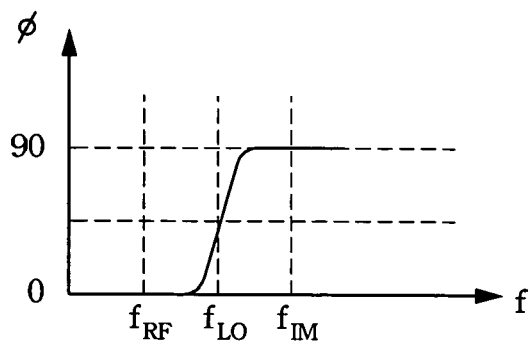
FIG. 4 shows a frequency response of the phase shifter 304 in FIG. 3.
Figure 5:
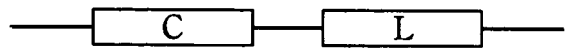
FIG. 5 shows an exemplary LC circuit implementing the phase shifter 304 in FIG. 3.

The splitter 338 includes phase shifters 302 and 304, and an automatic gain controller (AGC) 328. The phase shifter 302 shifts the phase of the signal 312 by −90 degrees to generate the split signal 314. The phase shifter 304 shifts the phase of only frequency components in the image channel of the signal 312. The phase shifter 304 has a frequency response so that, in the signal 312, the phases of frequency components at frequencies higher than a threshold are shifted by a first degree, and the phases of frequency components at frequencies lower than the threshold are shifted by a second degree different from the first degree. In this embodiment, the frequency response of the phase shifter 304 is the one shown in FIG. 4, wherein the threshold is $f_{LO}$, and the first and second degree are 90 and 0 respectively, and the first phase shifter 304 is implemented by a LC circuit shown in FIG. 5. The output of the phase shifter 304 is sent to the AGC 328 to generate the split signal 316. The gain of the AGC 328 is controlled by the output of the adder 306 so that the amplitude of the signal 316 is substantially equal to that of the signal 314.

The split signals 314 and 316 are added together by the adder 306. Since the frequency components of the signals 314 and 316 at frequencies higher than $f_{LO}$ have the same magnitude and a phase difference of 180 degrees, frequency components within the image channel (having a center frequency $f_{IM}$ higher than $f_{LO}$) are approximately zero in the output of the adder 306.

It is noted that, in the previously described embodiment, the frequency components in the image channel of the signal 312 are phase-shifted by different degrees and amplified by different gains through two paths. These degrees and gains are determined so that a sum of the frequency components of the split signals in the image channel is approximately zero. Similarly, in an alternative embodiment, the frequency components in the image channel of the signal 312 may be phase-shifted by different degrees and amplified by different gains through N paths. These degrees and gains are determined so that a sum of the frequency components of the split signals in the image channel is approximately zero. More specifically, the frequency components in the image channel of the signal 312 are amplified so that the amplitudes thereof in the N paths are the same, and phase-shifted so that each phase difference between two adjacent paths is 360/N degrees.

Figure 6:
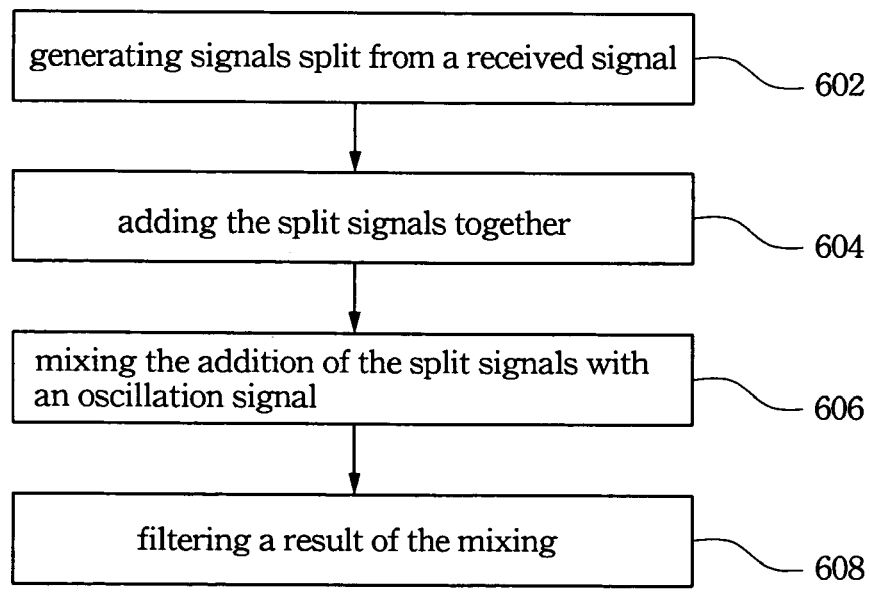
FIG. 6 shows a flowchart of a method for extracting information on a desired channel without interference introduced from an image channel into the desired channel according to one embodiment of the invention.

FIG. 6 shows a flowchart of a method for extracting information on a desired channel without interference introduced from an image channel into the desired channel according to one embodiment of the invention.

In step 602, signals split from a received signal having frequency components within the desired and image channel are generated. Then, in step 604, the split signals are added together. Next, in step 606, a result of the addition of the split signals is mixed with an oscillation signal having a frequency determined according to the desired channel. Subsequently, in step 608, a result of the mixing is filtered. The received signal is split so that, in the result of the addition of the split signals, frequency components within the desired channel is non-zero while those within the image channel is approximately zero. The detailed circuit realizing the method has been described in the previous embodiments.

Although the present invention has been described in considerable detail with reference to certain preferred embodiments thereof, other embodiments are possible. Therefore, their spirit and scope of the appended claims should not be limited to the description of the preferred embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A circuit for eliminating interference introduced from an image channel into a desired channel, the circuit comprising:
   a splitter for generating signals split from a received signal having frequency components within the desired and image channel, the splitter comprising:
   a phase shifter for shifting the phase of at least a frequency component in the image channel of the received signal for one of the signals output from the splitter; and
   an amplifier for amplifying an output of the phase shifter; and
   an adder for adding together the signals output from the splitter, the amplifier amplifying the output of the phase shifter by a gain controlled by an output of the adder;
   wherein the received signal is split so that, in the output of the adder, frequency components within the desired channel is non-zero while those within the image channel is approximately zero.

2. The circuit as claimed in claim 1, wherein the phase shifter has a frequency response so that, in the received signal, the phases of frequency components at frequencies higher than a threshold are shifted by a first degree, and the phases of frequency components at frequencies lower than the threshold are shifted by a second degree different from the first degree.

3. The circuit as claimed in claim 1, wherein the phase shifter is implemented by a capacitor and an inductor.

4. The circuit as claimed in claim 1, wherein the splitter comprising:
   a plurality of phase shifters, each of which shifts the phase of at least a frequency component in the image channel of the received signal by a degree for one of the signals output from the splitter, wherein each of the degrees is determined so that a sum of the shifted frequency components in the image channel is approximately zero.

5. A tuner for extracting information on a desired channel without interference introduced from an image channel into the desired channel, the tuner comprising:
   a splitter for generating signals split from a received signal having frequency components within the desired and image channel, the splitter comprising:
   a phase shifter for shifting the phase of at least a frequency component in the image channel of the received signal for one of the signals output from the splitter; and
   an amplifier for amplifying an output of the phase shifter;
   an adder for adding together the signals output from the splitter, the amplifier amplifying the output of the phase shifter by a gain controlled by an output of the adder;
   a mixer for mixing the output of the adder with an oscillation signal having a frequency determined according to the desired channel; and
   a band-pass filter for filtering an output of the mixer;
   wherein the received signal is split so that, in the output of the adder, frequency components within the desired channel is non-zero while those within the image channel is approximately zero.

6. The tuner as claimed in claim 5 further comprising:
   an antenna for receiving an RF signal; and
   a low-pass filter for filtering the RF signal and outputting the filtered RF signal as the received signal to the splitter.

7. The tuner as claimed in claim 5, wherein the phase shifter has a frequency response so that, in the received signal, the phases of frequency components at frequencies higher than that of the oscillation signal are shifted by a first degree, and the phases of frequency components at frequencies lower than that of the oscillation signal are shifted by a second degree different from the first degree.

8. The tuner as claimed in claim 5, wherein the phase shifter is implemented by a capacitor and an inductor.

9. The tuner as claimed in claim 5, wherein the splitter comprising:
   a plurality of phase shifters, each of which shifts the phase of at least a frequency component in the image channel of the received signal by a degree for one of the signals output from the splitter, wherein each of the degrees is determined so that a sum of the shifted frequency components in the image channel is approximately zero.

10. A method for extracting information on a desired channel without interference introduced from an image channel into the desired channel, the method comprising the steps of:
    generating signals split from a received signal having frequency components within the desired and image channel;
    adding the split signals together, wherein one of the split signals is generated by shifting a phase of at least one of the frequency components in the image channel of the received signal and further by amplifying a result of shifting by a gain controlled by a result of the addition of the split signals;
    mixing the result of the addition of the split signals with an oscillation signal having a frequency determined according to the desired channel; and
    filtering a result of the mixing;
    wherein the received signal is split so that, in the result of the addition of the split signals, frequency components within the desired channel is non-zero while those within the image channel is approximately zero.

11. The method as claimed in claim 10, further comprising the steps of:
    receiving an RF signal; and
    filtering the RF signal to generate the received signal.

12. The method as claimed in claim 10, wherein one of the split signals is generated by shifting by a first degree the phases of frequency components, of the received signal, at frequencies higher than that of the oscillation signal, and shifting by a second degree different from the first degree the phases of frequency components, of the received signal, at frequencies lower than that of the oscillation signal.

13. The method as claimed in claim 10, wherein each of the split signals is generated by shifting the phase of at least a frequency component in the image channel of the received signal by a degree, wherein each of the degrees is determined so that a sum of the shifted frequency components in the image channel is approximately zero.

* * * * *